United States Patent
Lin et al.

(10) Patent No.: US 8,381,139 B2
(45) Date of Patent: Feb. 19, 2013

(54) METHOD FOR METAL CORRELATED VIA SPLIT FOR DOUBLE PATTERNING

(75) Inventors: Burn Jeng Lin, Hsinchu (TW); Tsai-Sheng Gau, Hsinchu (TW); Ru-Gun Liu, Hsinchu (TW); Wen-Chun Huang, Tainan (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 126 days.

(21) Appl. No.: 13/006,608

(22) Filed: Jan. 14, 2011

(65) Prior Publication Data

US 2012/0135600 A1     May 31, 2012

Related U.S. Application Data

(60) Provisional application No. 61/418,204, filed on Nov. 30, 2010.

(51) Int. Cl.
*G06F 17/50* (2006.01)
(52) U.S. Cl. ............................................ 716/52; 716/50
(58) Field of Classification Search ............... 716/50–56
See application file for complete search history.

(56) References Cited

U.S. PATENT DOCUMENTS

| 2009/0217224 | A1 | 8/2009 | Wiaux et al. |
| 2010/0153905 | A1 | 6/2010 | Maeda |
| 2010/0196803 | A1 | 8/2010 | Lu et al. |
| 2011/0023002 | A1 | 1/2011 | Cheng et al. |
| 2011/0078638 | A1 | 3/2011 | Kahng et al. |
| 2011/0119648 | A1 | 5/2011 | Chen et al. |
| 2011/0197168 | A1 * | 8/2011 | Chen et al. ........... 716/50 |
| 2011/0219341 | A1 | 9/2011 | Cao et al. |
| 2012/0110521 | A1 * | 5/2012 | Agarwal et al. ...... 716/52 |

OTHER PUBLICATIONS

Arnold, William H., "Towards 3nm Overlay and Critical Dimension Uniformity: An Integrated Error Budget for Double Patterning Lithography", Optical Microlithography XXI, Proc. of SIE vol. 6924, 692404, (2008).

* cited by examiner

*Primary Examiner* — Stacy Whitmore
(74) *Attorney, Agent, or Firm* — Lowe Hauptman Ham & Berner, LLP

(57) ABSTRACT

The embodiments of via mask splitting methods for double patterning technology described enable via patterning to align to a metal layer underneath or overlying to reduce overlay error and to increase via landing. If adjacent vias violate the G0-mask-split-rule for space or pitch (or both) between vias, the mask assignment of end vias are given higher priority to ensure good landing of end vias, since they are at higher risk of mislanding. The metal correlated via mask splitting methods enable better via performance, such as lower via resistance, and higher via yield.

20 Claims, 11 Drawing Sheets

|  | M_1 | M_2 |
|---|---|---|
| V_1 | E | $\sqrt{2}$ E |
| V_2 | $\sqrt{2}$ E | $\sqrt{3}$ E |

Fig. 2D

|  | M_1 | M_2 | V_1 | V_2 |
|---|---|---|---|---|
| M_1 |  |  |  |  |
| M_2 | ○ |  |  |  |
| V_1 | ○ | ／ |  |  |
| V_2 | ／ | ○ | ／ |  |

Fig. 3A

|  | M_A | M_B |
|---|---|---|
| V_A | E | — |
| V_B | — | E |

METHOD FOR METAL CORRELATED VIA SPLIT FOR DOUBLE PATTERNING

CROSS REFERENCES TO RELATED APPLICATIONS

The present application claims priority of U.S. Provisional Patent Application Ser. No. 61/418,204, filed on Nov. 30, 2010, which is incorporated herein by reference in its entirety.

The present application is related to U.S. application Ser. No. 12/788,789, entitled "Method for Checking and Indexing Double Patterning Layout," filed on May 27, 2010, which is incorporated herein by reference in its entirety.

TECHNICAL FIELD

The present disclosure relates to semiconductor fabrication generally, and more specifically, to double patterning.

BACKGROUND

Double patterning is a technology developed for lithography to enhance the feature density. Typically, for forming features of integrated circuits on wafers, lithography technology is used which involves applying a photo resist and defining patterns on the photo resist. The patterns in the patterned photo resist are first defined in a lithography mask, and are implemented either by the transparent portions or by the opaque portions in the lithography mask. The patterns in the photo resist are then transferred to the manufactured features.

With the increasing down-scaling of integrated circuits, the optical proximity effect posts an increasingly greater problem. When two separate features are too close to each other, the space and/or pitch between the features could be beyond the resolution limit of the light source. To solve such a problem, double patterning technology is one solution. The closely located features are separated into two masks of a same double-patterning mask set, with both masks used to pattern the layer. In each of the double-patterning masks, the distances between features are increased over the distances between features in a single mask, and hence, the resolution limit can be overcome.

BRIEF DESCRIPTION OF THE DRAWINGS

For a more complete understanding of the embodiments, and the advantages thereof, reference is now made to the following descriptions taken in conjunction with the accompanying drawings, in which:

FIG. 2D shows the overlay errors between a metal layer and a via layer, in accordance with some embodiments.

FIG. 3A shows 3 overlay relationships for double patterning masks of a metal layer and a via layer, in accordance with some embodiments.

DETAILED DESCRIPTION

Figure 1A:
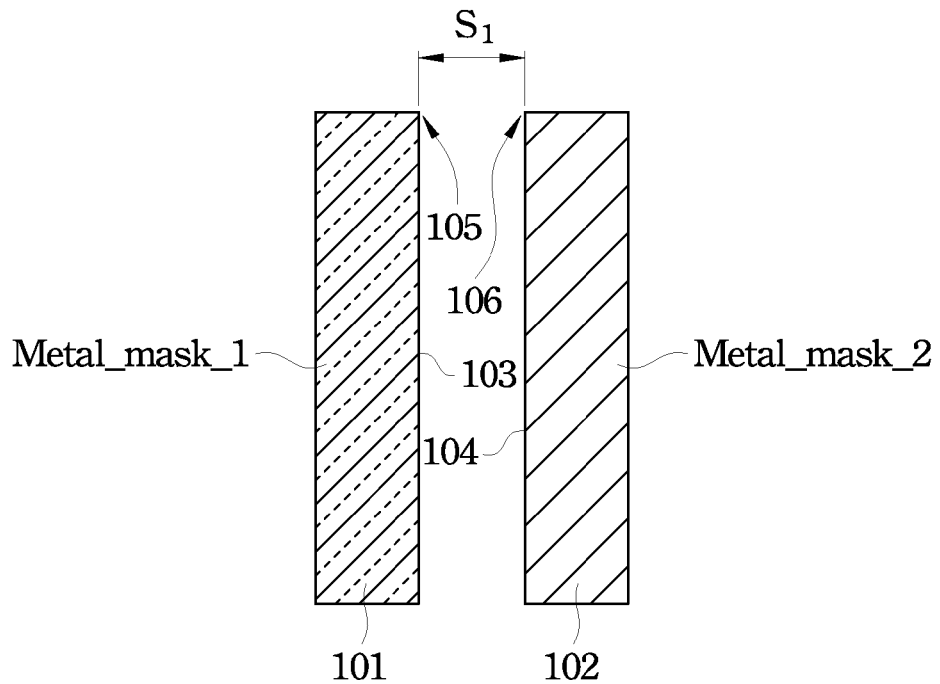
FIG. 1A shows two adjacent metal structures, in accordance with some embodiments.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

An IC layout includes multiple patterns on many layers. The distance between adjacent elements may be too small to be on the same mask, but not so small to be beyond the capability of the technology node. Adjacent elements may violate the single mask rules, and needs to be printed by two separate masks to ensure good resolution. Structures that are separated with sufficient spaces do not violate G0-rules and can be patterned by the same mask. G0-rules specify conditions that adjacent structures are printed by separate masks. FIG. 1A shows two adjacent metal structures, 101 and 102, in accordance with some embodiments. Metal structures 101 and 102 are separate by a space "S1", which is less than the minimum space "S" between metal structures allowed for patterning with one single mask. In some embodiments, "S" depends on the metal widths and could be larger for metal structures with narrower widths. For example, S may be about 76 nm for metal widths less than about 46 nm and be about 58 nm for metal widths equal to or greater than about 46 nm. As a result, metal structure 101 is patterned by a "Metal_mask_1" and structure 102 is patterned by a "Metal_mask_2", or vice versa. Patterning these two adjacent metal structures with two different masks enables good resolution of both neighboring metal lines 103 and 104, and adjacent corners 105 and 106, in accordance with some embodiments.

Figure 1B:
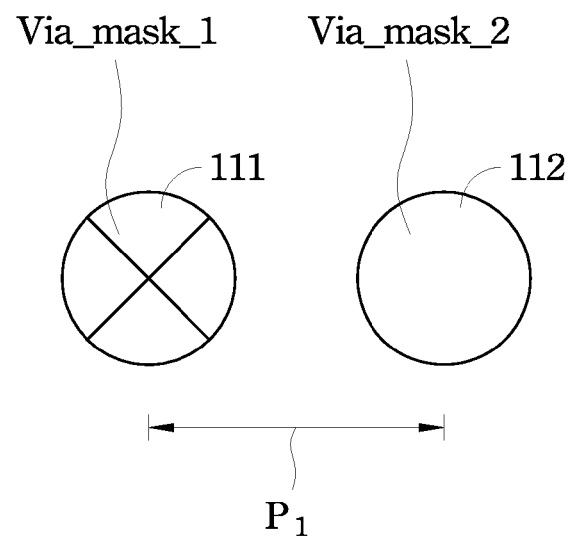
FIG. 1B shows two adjacent vias in accordance with some embodiments.

FIG. 1B shows two adjacent via structures 111 and 112, in accordance with some embodiments. The pitch of vias 111 and 112, or the distance between centers of vias 111 and 112, is "P1", which is less than the minimum pitch "P" specified for patterning two neighboring vias with one single mask. In some embodiments, P is in a range from about 70 nm to about 120 nm. As a result, via 111 is patterned by a "Via_mask_1" (marked with a cross in the via) and via 112 is patterned by a "Via_mask_2", or vice versa. Patterning these two adjacent via structures with two different masks enables good resolution of both vias 111 and 112, which are separated by a pitch "P1" that is considered to small (smaller than the limit "P"), in accordance with some embodiments.

For formation of structures that utilize double patterning technology, the layout of the layer is marked by two colors. Each of the two colors is associated with a particular mask of the two patterning masks. Structures of a layer are assigned to one of the two colors. Structures with the same color are patterned on the same mask, in accordance with some embodiments. The assignment of color (or mask) of structure often occurs after the layout is done. A design rule checker (DRC) could be used to systematically identify structures that violate the G0-mask-split rules, in accordance with some embodiments. Algorithms are set up and used to assign the identified structures to one of the two colors, i.e. one of the two masks.

Design Rule Checker (DRC) software can systematically check mask split rules by showing all neighboring structures that meet the mask split rules and require to be patterned by two separate masks in a layout design. A designer enters the necessary mask split rules, into the DRC using its design rule language, such as Standard Verification Rule Format (SVRF) or a software specific Tool Command Language (TCL), in accordance with some embodiments. The mask split rules may specify the criteria for a particular spatial relationship to be a G0-space, such as run-to-run distance, corner-to-corner distance, end-to-end distance or run-to-end distance. The mask split rules may also specify the criteria for a particular pitch relationship to be a G0-pitch, such as metal pitch or via pitch.

The DRC software then take the layout input in a standard format, such as Graphic Data System II (GDSII), and produce an output that shows all the spatial relationships that are G0-spaces, in accordance with some embodiments. Commonly used DRC software includes Calibre by Mentor Graphics; Hercules by Synopsys; Diva, Dracula, Assura, and PVS by Cadence Design Systems.

If a layout cannot be separated into two masks, the problem can be addressed by changing the layout design, in accordance with some embodiments. The layout design is usually changed by hand by a designer reviewing the G0-space output from a DRC software. Changing a layout design is time-consuming, because a designer aims to minimize the total volume of a design and a change often affects structures in other layers. A designer must evaluate many alternate fixes before selecting on the best solution. Additionally, some fixes does not necessarily resolve certain loop combinations. Therefore, improved methods for efficiently resolving DPT constraint violations are desired.

Figure 1C:
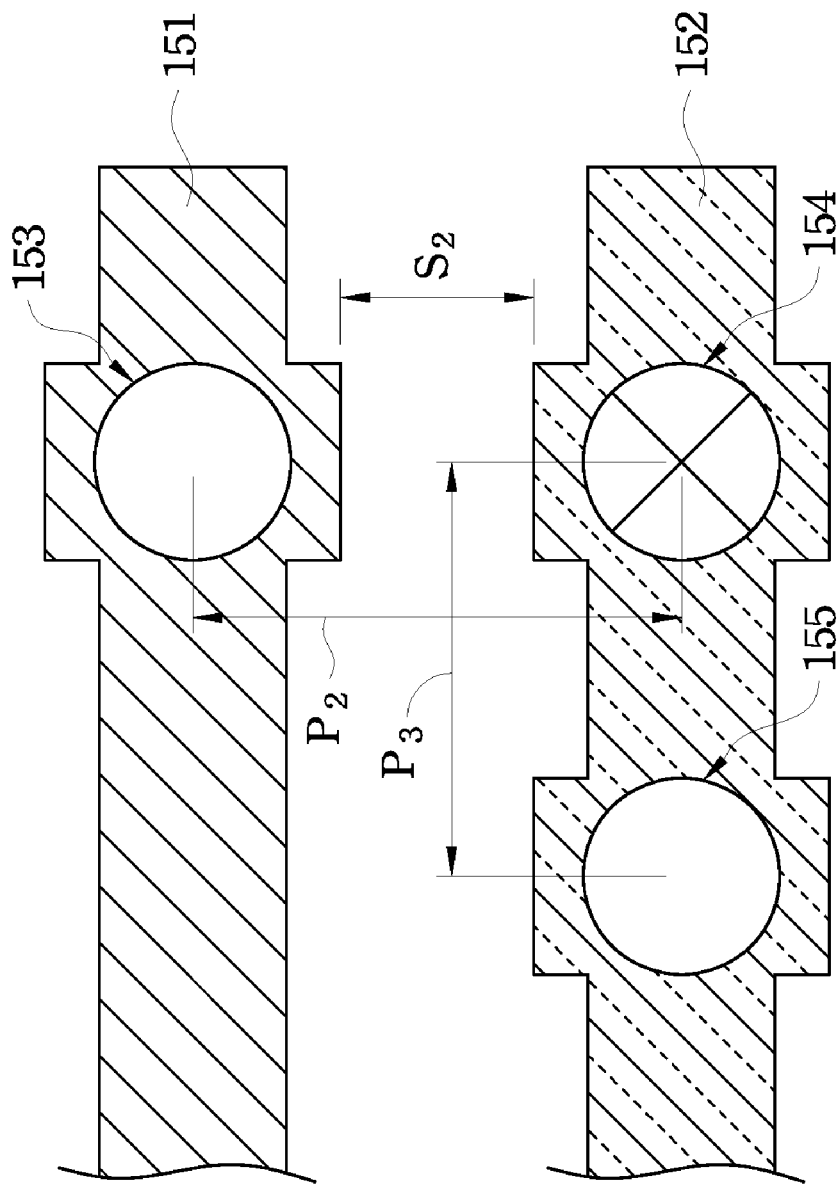
FIG. 1C show two adjacent metal structures with vias, in accordance with some embodiments.

Interconnect structures are built by forming vias over metal lines. To ensure making electrical connection, vias need to land on metal structures and have sufficient contacts with metal structures. FIG. 1C shows a top view of metal and via structures, in accordance with some embodiments. FIG. 1C shows two metal structures 151 and 152, which are separated by a space "S2", which is smaller than the G0-rule for metal space of "S". As a result, metal structures 151 and 152 are patterned by two different metal masks. FIG. 1C also shows three vias 153, 154, and 155. Vias 153 and 154 have a pitch "P2" and vias 154 and 155 have a pitch "P3". Both "P2" and "P3" are smaller than the minimum pitch "P" specified for vias. Due to violation of the via G0-rule, vias 153 and 154 are patterned by two different masks. Similarly, vias 154 and 155 are printed by two different masks to fulfill the requirements for two different patterning masks for vias 153 and 154, and for vias 154 and 155. As a result, vias 153 and 155 are patterned by the same mask, which is different from the mask for via 154.

Figure 1D:
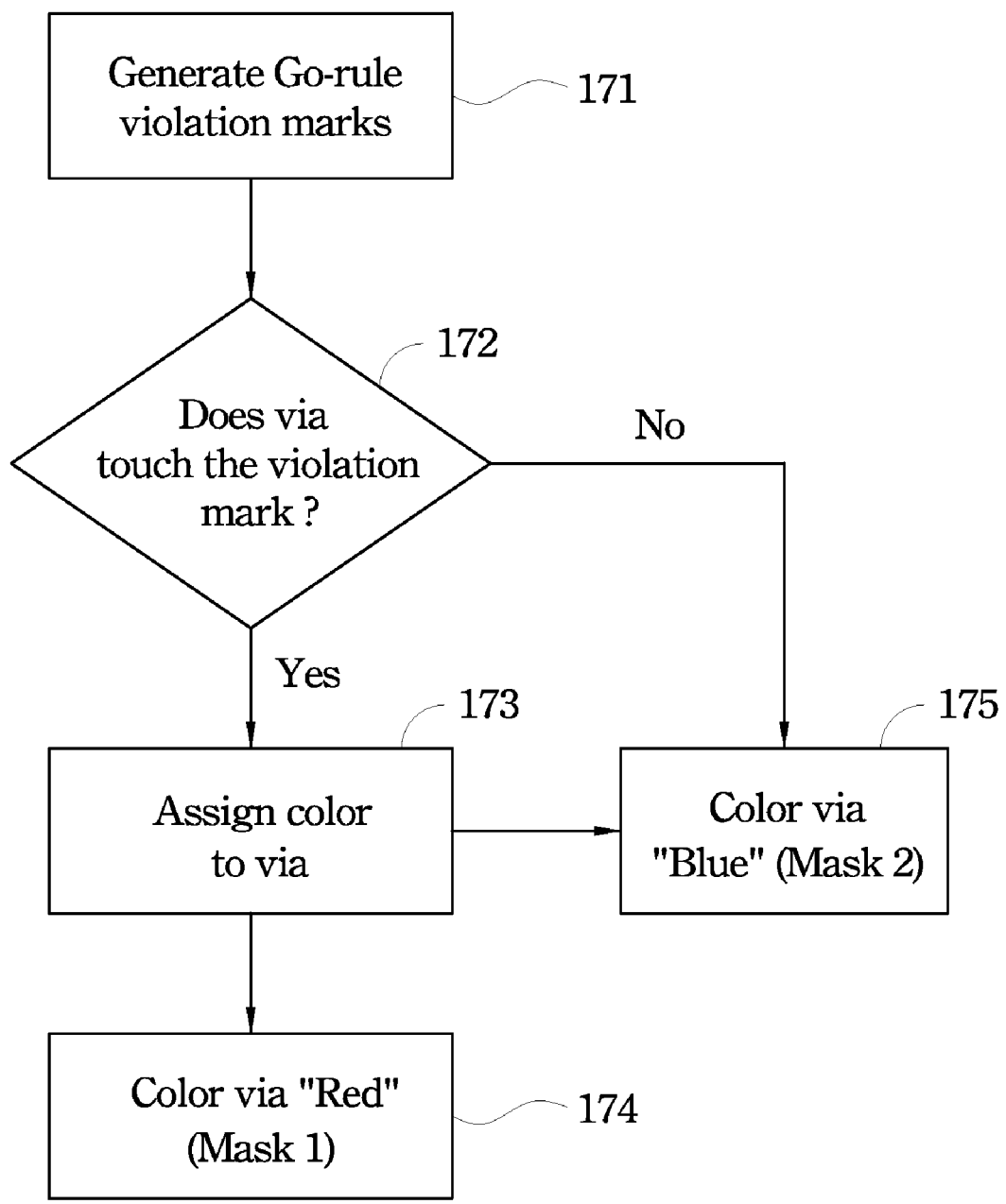
FIG. 1D shows a process flow for mask split for a via layer, in accordance with some embodiments.

FIG. 1D shows a process flow 170 for mask split for a via layer, in accordance with some embodiments. At operation 171, violation marks are generated to mark structures that meet the G0-mask-split-rule(s), such as G0-space and G0-pitch, for vias when the via layout is checked against G0-mask-split-rule(s) for vias. An example of the violation mark could be a straight line connecting two structures violating the G0-pitch or G0-space.

Figures 1E, 2A:
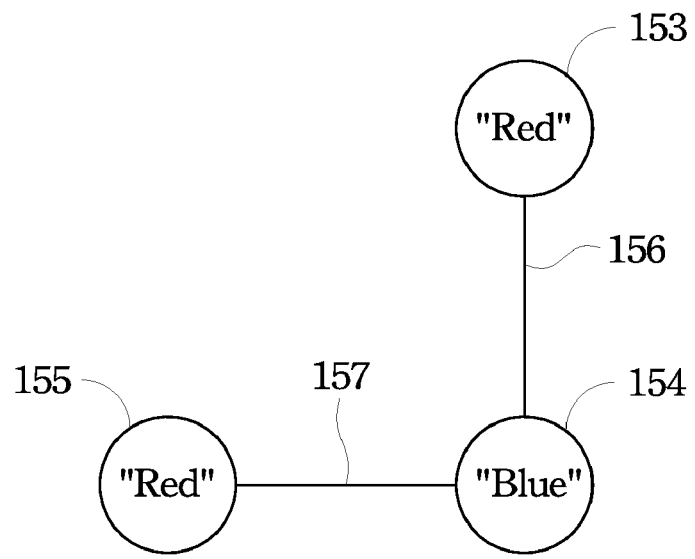
FIG. 1E shows three adjacent vias, in accordance with some embodiments.
FIG. 2A shows the 6 possible alignment relationships among 2 metal masks and 2 via masks, in accordance with some embodiments.

Afterwards, the process flow proceeds to operation 172 of determining if via structures touch the violation marks. For via structures that touch the violation marks, the via structures are colored by one of the two colors, which symbolizes (or identifies with) the two via masks. FIG. 1E shows vias 153 and 154 are connected by a straight line 156 due to a G0-mask-split-rule violation, in accordance with some embodiments. Similarly, vias 154 and 155 are connected by another straight line 157. Some algorithms are involved in operation 173 in determining which vias are assigned the first mask (color "Red") and the others are assigned the second mask (color "Blue"). In the example shown in FIG. 1D, the via could be assigned to be colored "Red" (associated with "Mask 1") at operation 174 or to be colored "Blue" (associated with "Mask 2") at operation 175. Vias that do not violate any G0-mask-split-rule are assigned to "Blue" color in the exemplary embodiment shown in FIG. 1D. Alternatively, vias that do not violate the G0-mask-split-rule(s) could be assigned to "Red," depending on the coloring rules. FIG. 1E shows that vias 153 and 155 are assigned to color "Red" and via 154 is assigned to color "Blue". The color assignment in FIG. 1E meets the requirement that vias 153 and 154, and vias 154 and 155 need to be patterned by different masks respectively.

For double patterning technology, the $2^{nd}$ patterning mask of a layer may align with the $1^{st}$ patterning mask for the layer, such as metal_mask_2 aligns with metal_mask_1 or via_mask_2 aligns with via_mask_1. In addition, the $1^{st}$ via mask aligns with one of two metal masks that are used to pattern the metal under the vias. Overlay control defined the control of pattern-to-pattern alignment. FIG. 2A shows the 6 possible alignment relationships among 2 metal masks, M_2 and M_1, of a metal layer and 2 via masks, V_2 and V_1, of a via layer, in accordance with some embodiments. The six possible relationships (shown by "X" mark) include:

1. M_2 aligns with M_1,
2. V_1 aligns with M_1,
3. V_1 aligns with M_2,
4. V_2 aligns with M_1,
5. V_2 aligns with M_1, and
6. V_2 aligns with V_1

Since there are 4 masks for a via layer over a metal layer, there are only 3 possible alignment arrangement. As mentioned above, one possible alignment scheme uses the following 3 alignment arrangement, as shown by "O" mark in FIG. 2A.

1. M_2 aligns with M_1,
2. V_2 aligns with V_1, and
3. V_1 aligns with M_1.

Figure 2B:
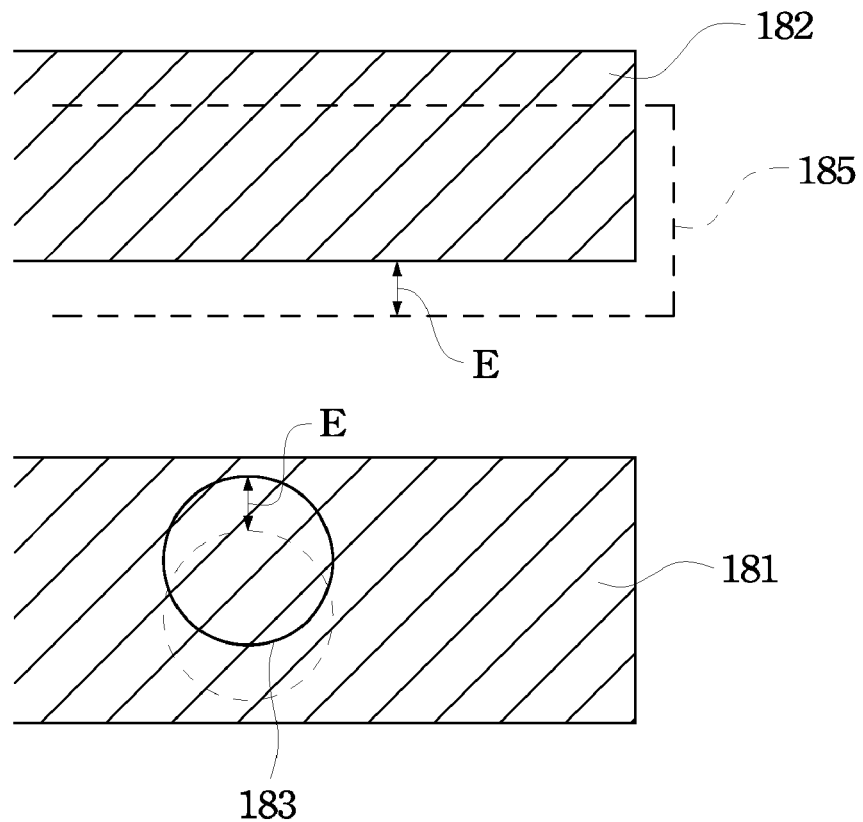
FIG. 2B shows two metal structures patterned by two different masks, in accordance with some embodiments.
Figure 2C:
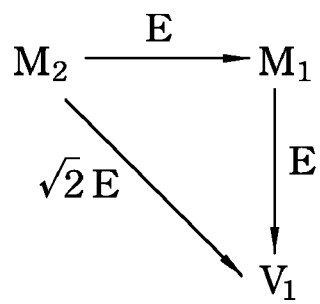
FIG. 2C shows the relationship of overlay errors between two patterning masks of a metal layer and a via mask, in accordance with some embodiments.

The other three relationships that are not selected for alignment will be subjected to indirect overlay control. Overlay control is subjected to certain degree of error, described as "E". "E" reflects the overlay capability of the tool. FIG. 2B shows the a metal structure 181, patterned by a metal mask M_1, and another metal structure 182, patterned by a metal mask M_2, in accordance with some embodiments. In the embodiments of FIG. 2B, metal mask M_2 is aligned with metal mask M_1. As mentioned above, overlay may suffer from overlay error "E". FIG. 2B shows that metal structure 182 has shifted with an amount of "E" due to overlay error, with dotted line 185 being the intended metal boundary for metal structure 182. FIG. 2B also shows a via 183 patterned over metal structure 181. The via 183 is patterned by V_1 mask, which is aligned with M_1 mask. Via 183 may also suffer from an overlay error with a maximum amount of "E". Since via 183 is not aligned to metal structure 182, the maximum overlay error between via 183 and metal structure 182 could be 1.414 E statistically, or $\sqrt{2}$E. FIG. 2C shows the relationship of overlay errors between M_1, M_2, and V_1, in accordance with some embodiments. FIG. 2C show that the maximum overlay error between metal structures patterned by metal mask M_2 and metal mask M_1 may be "E," and the maximum amount of overlay error between a via patterned by via mask V_1 and a metal structure patterned by metal mask M_1 also may be "E." As a result, the maximum amount of overlay error between the via patterned by via mask V_1 and the metal structure patterned by metal mask M_2 (indirect overlay) may be "1.414E" statistically, or $\sqrt{2}$E.

FIG. 2D shows the overlay errors between metal structures patterned by metal masks M_1 and M_2, and via structures patterned by via masks V_1 and V_2, in accordance with some embodiments. The double patterning scheme used is described above with M_2 aligned to M_1, V_2 aligned to V_1, and V_1 aligned to M_1. FIG. 2D shows that due to indirect overlay, the overlay error between M_2 and V_1 is $\sqrt{2}$E, or 1.414 E, and the overlay error between V_2 and M_1 is also $\sqrt{2}$E. Since M_2 is aligned with M_1, V_1 is aligned with M_1, and V_2 is aligned with V_1, the overlay error between M_2 and V_2 is $\sqrt{3}$E, or 1.732 E. The analysis above shows that indirect overlay results in excessive overlay error, which could become a serious problem for via landing on metal structures and needs to be reduced.

As shown above in FIG. 1C, vias 153, 154, 155 are landed on metal structures 151, 152 for electrical connection. To ensure sufficient landing areas for vias, narrow metal structures are widened near vias, in accordance with some embodiments. FIG. 1C shows metal structures 151 and 152 are made wider around vias 153, 154 and 155 to meet the design rule set to ensure sufficient landing areas for vias. Landing of vias on metal structure is critical to ensure good electrical connection. However, for advanced technologies, such widening might not occur to allow higher device densities on chips. FIG. 3A shows 3 overlay relationships used to ensure good via to metal landing, in accordance with some embodiments. The 3 overlay relationships include:
1. M_2 aligned with M_1,
2. V_1 aligned with M_1, and
3. V_2 aligned with M_2

In the embodiments described above in FIG. 3A, vias that intercept the metal layer underneath are assigned to the related metal mask. For example, vias that intercept (or land on) metal structures that are patterned by M_1 are patterned by the same mask, V_1. Since V_1 aligns with M_1, the vias on the metal structures patterned by M_1 have the best possibilities to land properly on the metal structures underneath due to direct alignment. Similarly, the vias on the metal structures patterned by M_2 mask should be patterned by a different via mask, V_2, which aligns with M_2 patterns.

Figure 3B:
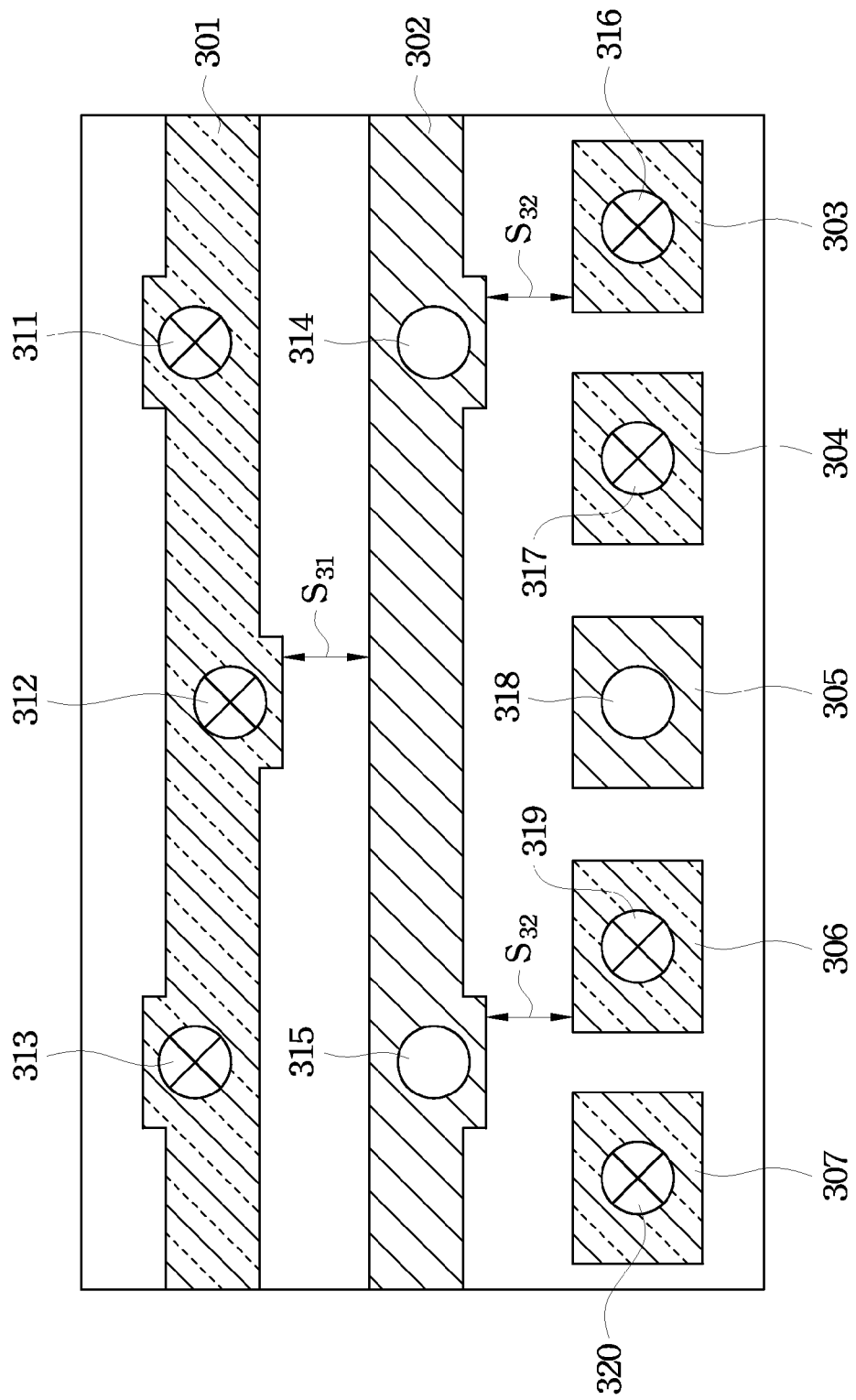
FIG. 3B shows a number of metal structures and a number of via structures on a substrate, in accordance with some embodiments.

FIG. 3B shows a number of metal structures 301-307 and a number of via structures 311-320, in accordance with some embodiments. FIG. 3B shows that metal structures 301, 303, 304, 306 and 307 are patterned by a M_A mask and metal structures 302 and 305 are patterned by a M_B mask. The assignment of M_A and M_B masks is based on G0-rules. The minimal space, S31, between structures 301 and 302, the minimal space, S32, between structures 302, 303, 304, 306 and 307, are less than the minimal space, S, of G0-rule. As a result, the metal structures are assigned to different metal masks, as described above. Vias 311-320 are shown in FIG. 3B to land on different metal structures. Vias 311-320 are assigned to two different via masks according their intersection (or landing) with the metal layer underneath. For example, vias 311-313, 316, 317, 319, and 320 are assigned to V_A, which aligns with M_A, and vias 314, 315, and 318 are assigned to V_B, which aligns with M_B. Such mask assignment scheme improves the possibility of landing and minimizes mis-landing.

Figures 3C, 3D:
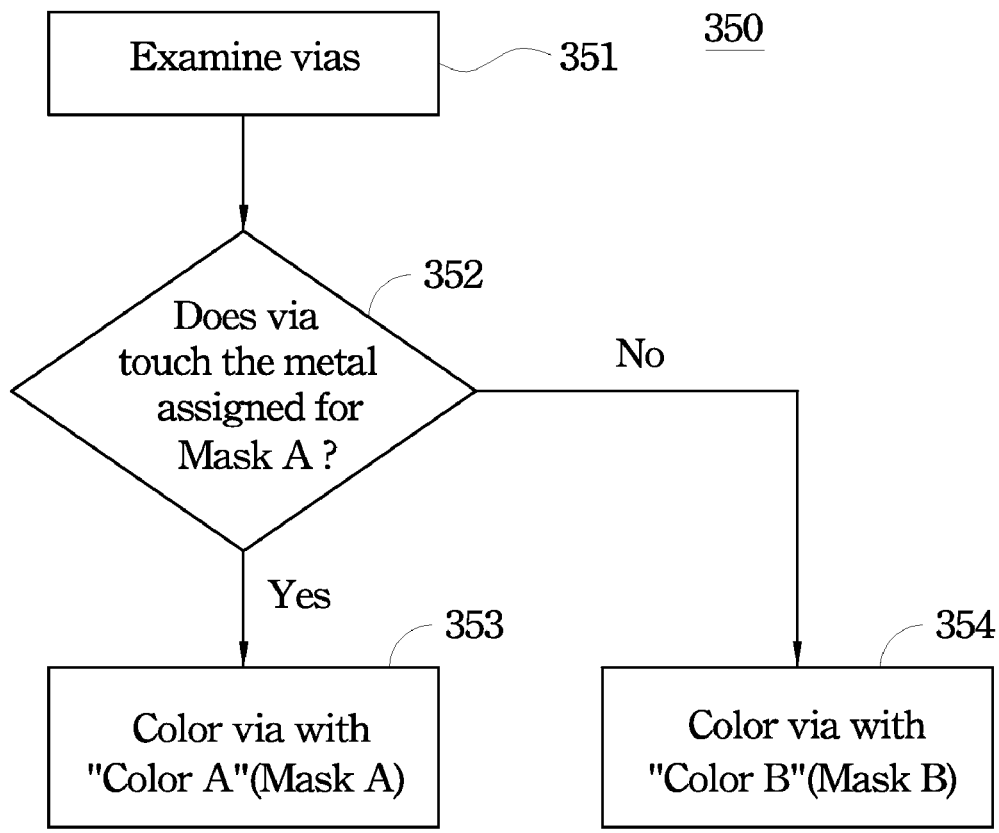
FIG. 3C shows the overlay errors between structures patterned by double patterning technology of a metal layer and a via layer, in accordance with some embodiments.
FIG. 3D shows a process flow of assigning mask for a via layer for double patterning, in accordance with some embodiments.

FIG. 3C shows the overlay errors between structures patterned by different metal and vias masks M_A, M_B, V_A and V_B, in accordance with some embodiments. The double patterning scheme used is described above with M_B aligned to M_A, V_A aligned to M_A, and V_B aligned to M_2. FIG. 3C shows that due to direct overlay, the overlay error between V_A and M_A is E and the overlay error between V_B and M_B is also E, which is much smaller than 1.732E of the scheme shown in FIGS. 2A-2D. Since all vias patterned by V_A intersect with metal structures patterned by M_A, there is no reason to be concerned with the overlay error between V_B and M_A. Similarly, there is also no reason to be concerned with the overlay error between V_A and M_B.

The analysis above shows that metal-mask-correlated via mask split provides better overlay errors. Indirect overlay results in excessive overlay error. By aligning via mask with correlated metal mask, the via yield would be improved. FIG. 3D shows a process flow 350 of assigning mask for a via layer for double patterning, in accordance with some embodiments. Process flow 350 operates after mask assignment for the underlying metal layer (layer underneath the via layer) is completed. At operation 351, vias are checked to determine which masks they are assigned for patterning. At operation 352, a decision regarding if they land on (or intercept, or touch) metal structures assigned with a particular mask, such as "Metal Mask A," is made. If the answer is yes, the vias are assigned to operation 353 to be colored by a "Color A" representing "Via Mask A," which aligns with the "Metal Mask A." Otherwise, the vias are assigned to operation 354 to be colored by a "Color B" representing "Via Mask B." which aligns with "Metal Mask B."

The mask assignment scheme described above for a via layer over a metal layer can be applied to all vias and metal structures without conflict if certain criteria or design-rule constraints are met. The design-rule constraints are listed below:
1. Vias on the same metal structures should not have a pitch less than "P" to ensure that vias on the same metal structures not violating the via G0-pitch, and
2. Via G0-space rule for vias on separate metal structures should be looser than metal G0-space rule to ensure that when metal structures do not violate the metal G0-space rule (i.e. could be printed by a single mask), the vias also do not violate the via G0-space rule and can be printed on a single mask that correlate with the metal mask.

The 1$^{st}$ constraint described above allows all vias on the same metal structures to be assigned to the same via mask. If the pitch(es) between the vias on the same metal structure is less than "P", the vias violates the G0-rule for via pitch and are separated into different masks, which contradict with the proposed scheme. The $2^{nd}$ constraint allows the vias on neighboring metal structures that do not violate G0-rule for metal space not to violate G0-rule for via space.

The alignment method described above would reduce alignment (or overlay) errors and increase the landing of vias on metal structures. In some embodiments, the two design rule restraints described above might be deemed too restricting and might not be followed. Under such circumstances, algorithms are set up and used to handle the violation of G0-mask-split-rules for vias, which, for example, may include rules for via pitch and space between vias.

Figure 4A:
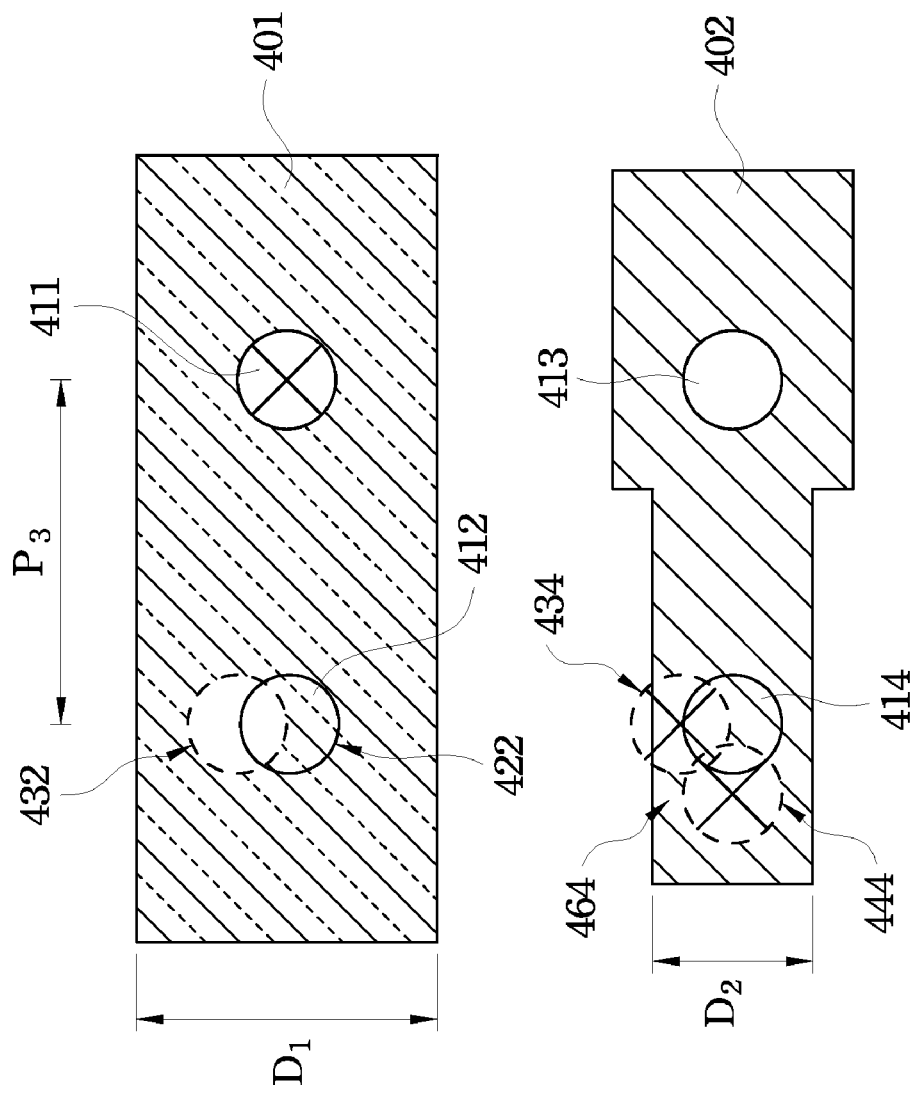
FIG. 4A shows two metal structures and four vias on a substrate, in accordance with some embodiments.

FIG. 4A shows metal structures 401 and 402 and vias 411-414, in accordance with some embodiments. The width "D1" of metal structure (or line) 401 is wider than the width "D2" of metal structure (or line) 402. According to the mask assignment algorithm described above, if metal structure 401 is assigned a M_01 mask, vias 411 and 412 that land on metal structure 401 would be assigned to a V_01 mask that aligns with M_01 mask. Similarly, vias 413 and 414 that land on metal structure 402, which is assigned to a M_02 mask, would be assigned to a V_02 mask that aligns with M_02 mask. However, vias 411 and 412 violate the G0-rule for pitch for having a pitch "P3" that is smaller than the specification. As a result, either via 411 or via 412 would be assigned to a different mask. For example, via 412 is assigned to V_02. Since V_02 is not aligned to M_01, the potential overlay error (statistically 1.414E) would be greater than the overlay error "E" for V_01 aligning with M_01. FIG. 4A shows the solid outline 422 of via 412 as the intended via location, and dotted outline 432 as the printed location. Since the metal structure (or line) 401 is relatively wide, the printed via outline 432 of via 412 lands completely over (or inside) metal structure 401.

Vias 413 and 414 also violate the G0-mask-split-rule for pitch for having a pitch "P4" that is smaller than the specification. As a result, either via 413 or via 414 is assigned to a different mask. For example, via 414 is assigned to V_01. Since V_01 is not aligned to M_02, the potential overlay error (statistically 1.414E) would be greater than the overlay error "E" for V_02 aligning with M_02. FIG. 4A shows the solid outline 424 of via 414 as the intended via location and dotted outline 434 as the printed location, in accordance with some embodiments. Since the metal structure (or line) 402 near via 414, with a width "D2", is narrower than metal structure 402 near via 413 (with a width "D3"), a portion of the printed via outline 434 of via 414 lands outside (or inside) metal structure 402. Incomplete landing may lead to high resistance or poor coverage of adhesion and/or barrier layer for via, which can result in interconnect reliability issues. In some other embodiments, via 414 is printed with dotted line 444, which lands outside the printed line (dotted line 464) end of metal structure 402. Since metal structure 402 is narrower, it likely suffers from "line end shortening," which is a shortened and rounded metal profile at metal end as a result of printing and etching. The incomplete landing may also lead to high via resistance or even no connection between via 414 and metal structure 402.

Therefore, the overlay error (or mis-alignment) of vias, such as via 413, with an underlying narrow metal structure is to be minimized. Vias on narrower metal structures (or metal lines) are called "end vias," such as via 414, while vias on wider metal structures are call "run vias," such as via 413. In some embodiments, vias on metal structures with widths less than a certain width, such as about 90 nm, are called "end vias." To increase the number of working vias and to reduce potential reliability issues, "end" vias should be dealt with at a higher priority than "run" vias to enable them to be aligned with the metal mask during patterning. As a result, via 414, an end via, is assigned V_02 to align with M_02 and via 413, a run via, is assign V_01, which does not align with M_02. The risk of via 413 not landing completely inside metal structure 402 is much smaller than via 414, as shown in FIG. 4A.

Figure 4B:
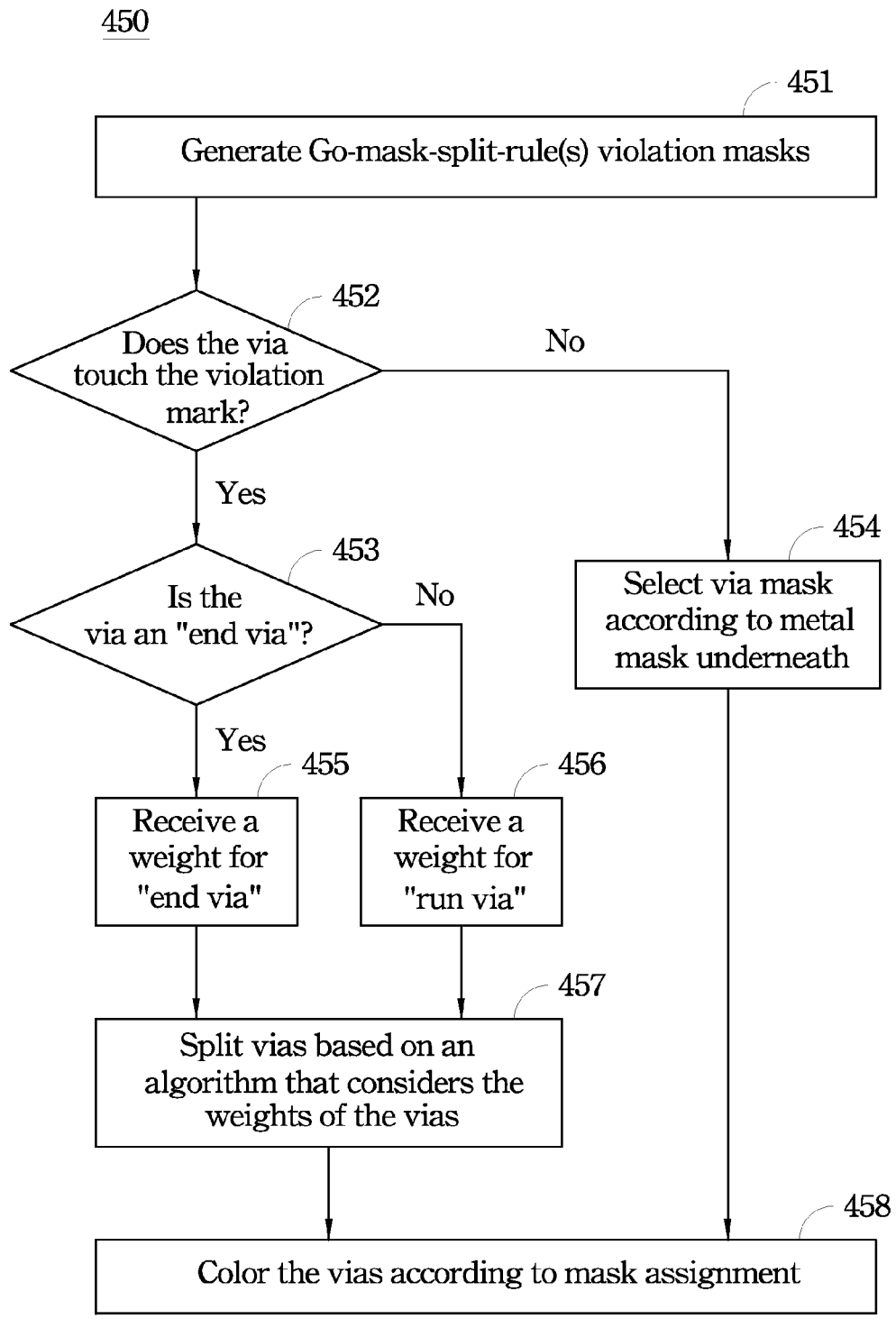
FIG. 4B shows a process flow of assigning masks for a via layer, in accordance with some embodiments.

FIG. 4B shows a process flow 450 of assigning masks for vias, in accordance with some embodiments. At operation 451, violation marks are generated to mark structures that violate the G0-mask-split-rule(s) for vias when the via layout is checked against rule(s). As described above, the G0-mask-split rules for vias may include G0-space and/or G0-pitch rules. Afterwards, the process flow proceeds to operation 452 of determining if via structures touch the violation marks. For via structures that touch the violation marks, another decision is made regarding whether the via is an end via at operation 453. For vias that do not touch the violation marks, the process proceeds to operation 454 of assigning via mask based on the mask assigned for the metal layer underneath the vias. Back to operation 453, if the via is an end via, the process flow proceeds to operation 455, where the via mask is assigned (or receives) a weight for being an end via. The weight assigned for end vias is larger to give it more importance and higher priority in mask splitting to allow end vias to be assigned to via masks that align to the metal structures with assigned metal masks. Such preferential mask assignment enables better via landing on metal structures, lower via resistance and higher yield. In some embodiments, the end vias separated into different categories and high-risk end vias has higher weight (or higher priority) than low-risk end vias.

If the vias is not an "end via", but a "run via" instead, the process flow proceeds to operation 456, where the via is assigned (or receives) a weight. Since run vias have lower risks in via landing, the weight is lower than end vias. After the vias are assigned with weights, the process proceeds to operation 457, wherein the vias are assigned to different masks (one of the two masks) based on a via splitting algorithm. The algorithm takes the weights of the vias into consideration in splitting masks. End via (with higher weights) are given higher priority in being assigned via masks that align with the metal masks for the metal structures underneath. Afterwards, the process flow proceeds to operation 458, where the vias are colored with one of the two colors, which represent two separate masks. Operation 454 also proceeds to operation 458.

The embodiments of methods described above focus on correlating the splitting of via masks for a via layer to the metal masks of an underlying metal layer. Alternatively, the mask splitting of a via layer may correlate to the metal masks of an overlying metal layer. Vias of a via layer not only need to land on an underlying metal layer, but also need to be covered by an overlying metal layer. Therefore, the operation 457 described above may be modified to assign via mask by an algorithm that takes into account the metal mask split of an overlying metal layer. Similarly, the operation 352 described above may also be revised to based on the decision of via assignment on the metal mask assignment of an overlying metal layer.

In one aspect according to various embodiments, a system for assigning masks for via and metal layers for double patterning technology is provided. The system may include a computer readable storage medium, a processor coupled to read the storage medium, and an output device. The processor may be part of a special purpose computer for G0-mask-split-rule and/or design rule checking configured to perform various methods as disclosed herein. The computer readable storage medium may include one or more of dynamic random access memory (RAM), SDRAM, a read only memory (ROM), EEPROM, a hard disk drive (HDD), an optical disk drive (CD-ROM, DVD-ROM or BD-ROM), or a flash memory, or the like. In some embodiments, the computer readable storage medium includes any type of non-transitory media. The output device may be a display, a printer, or the computer storage medium. The system may further include an input device for entering the layout data and/or adjustment to the layout data during one or more iterative resolution of the layout.

Figure 5:
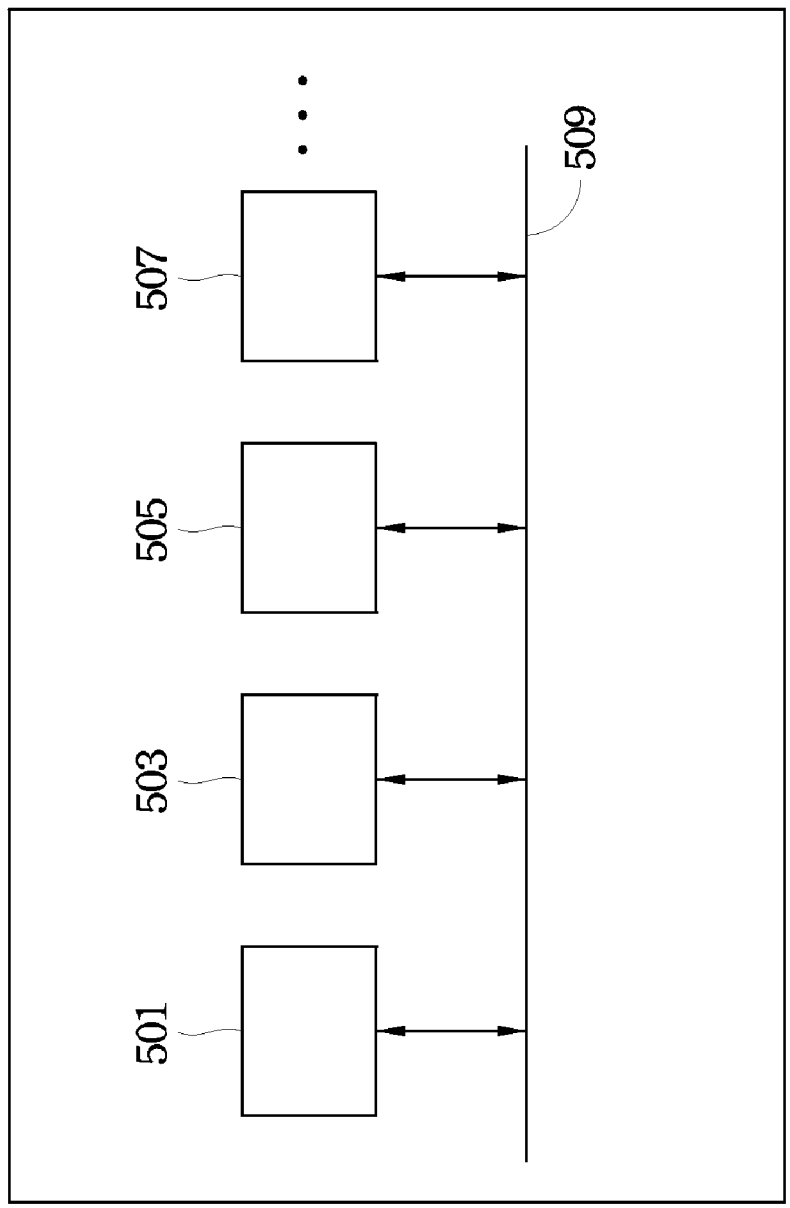
FIG. 5 shows a computer system, in accordance with some embodiments.

FIG. 5 shows a computer system 500, which may implement the embodiments of methods described above, in accordance with some embodiments. FIG. 5 shows one configuration of computer system 500 that includes at least one programmable processor 501 coupled to a memory subsystem 503. The memory subsystem 503 includes at least one form of memory, e.g., RAM, ROM, etc. The computer system may include a storage subsystem 505, which has at least one disk drive and/or CD-ROM drive and/or DVD drive. In some implementations, a display system, a keyboard, and a pointing device may be included as part of a user interface subsystem 507 to provide for a user to manually input information. Ports for inputting and outputting data also may be included. Other elements such as network connections, interfaces to various devices, etc., may also be included. The various elements of the computer system 500 may be coupled in various ways, including via a bus subsystem 509. The memory of the memory subsystem 503 may at some time hold part or all of a set of instructions that when executed on the computer system 500 implement the steps of the method embodiments described herein.

The embodiments of via mask splitting methods for double patterning technology described above enable via patterning to align to a metal layer underneath or overlying to reduce overlay error and to increase via landing. If adjacent vias violate the G0-mask-split-rule for space or pitch (or both) between vias, the mask assignment of end vias are given higher priority to ensure good landing of end vias, since they are at higher risk of mislanding. The metal correlated via mask splitting methods enable better via performance, such as lower via resistance, and higher via yield.

In one embodiment, a method of assigning via patterning mask for a via layer using double patterning technology is provided. The method includes determining if a via intercepts (intersects with) an underlying metal structure assigned to a first metal mask. If the via intercepts the underlying metal structure assigned to the first metal mask, the via is assigned to a first via mask, and the first via mask aligns with the first metal mask. Otherwise, the via is assigned to a second via mask, and the second via mask aligns with the second metal mask.

In another embodiment, a method of assigning via patterning mask for a via layer using double patterning technology is provided. The method includes generating via mask-split-rule violation marks for vias of the via layer, and the via mask-split-rule violation marks connect vias that violate at least a via mask-split rule. The method also includes determining if a via touches the via mask-split-rule violation marks. If the via does not touch the via mask-split-rule violation marks, selecting via mask according to mask assigned to an underlying metal structure of the via. If the via touches the via mask-split-rule violation marks, proceeding to the next determining operation of determining if the via is an end via. If the via is an end via, assigning a first weight to the via, and if the via is not an end via, assigning a second weight to the via. The method further includes assigning one of the two via masks to the via by an algorithm, and the algorithm gives vias with the first weight higher priority in being assigned to via masks aligning to metal structures that the vias land on.

In another embodiments, a method of assigning via patterning mask for a via layer using double patterning technology is provided. The method includes determining if a via intercepts an overlying metal structure assigned to a first metal mask. If the via intercepts the overlying metal structure assigned to the first metal mask, the via is assigned to a first via mask, and the first via mask aligns with the first metal mask. Otherwise, the via is assigned to a second via mask, and the second via mask aligns with the second metal mask.

In another embodiments, a computer system for performing a method of assigning via patterning mask for a via layer using double patterning technology is provided. The method comprises the operations of determining if a via intercepts an underlying metal structure assigned to a first metal mask, if the via intercepts the underlying metal structure assigned to the first metal mask, the via is assigned to a first via mask, wherein the first via mask aligns with the first metal mask, otherwise, the via is assigned to a second via mask, wherein the second via mask aligns with the second metal mask.

In yet another embodiment, a computer-readable storage medium embodying instructions for performing a method of assigning via patterning mask for a via layer using double patterning technology is provided. The method comprises the operations of generating via mask-split-rule violation marks for vias of the via layer, wherein the via mask-split-rule violation marks connect vias that violate at least a via mask-split rule, determining if a via touches the via mask-split-rule violation marks, if the via does not touch the via mask-split-rule violation marks, selecting via mask according to mask assigned to an underlying metal structure of the via, if the via touches the via mask-split-rule violation marks, proceeding to the next determining operation of: determining if the via is an end via, if the via is an end via, assigning a first weight to the via, if the via is not an end via, assigning a second weight to the via, assigning one of the two via masks to the via by an algorithm, wherein the algorithm gives vias with the first weight higher priority in being assigned to via masks aligning to metal structures that the vias land on.

Although exemplary embodiments and its advantages have been described in detail, it should be understood that various changes, substitutions and alterations can be made herein without departing from the spirit and scope defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of via patterning mask assignment for a via layer using double patterning technology, wherein vias of the via layer land on respective underlying metal structures, said method comprising:
generating via mask-split-rule violation marks for vias of the via layer, wherein the via mask-split-rule violation marks connect vias that violate at least a via mask-split rule;

determining, by a processor, if a via touches one of the via mask-split-rule violation marks,
if the via does not touch one of the via mask-split-rule violation marks, assigning the via to one of two via masks which aligns with the underlying metal structure on which the via lands,
if the via touches one of the via mask-split-rule violation marks, proceeding to determine if the via is an end via,
if the via is an end via, assigning a first weight to the via,
if the via is not an end via, assigning a second weight to the via, and assigning each via that touches one of the via mask-split-rule violation marks to one of the two via masks such that vias with the first weight are given higher priority in being assigned to the via masks aligning with the underlying metal structures that the vias land on.

2. The method of claim 1, wherein the end via is a via that lands on the underlying metal structure where the underlying metal structure has a width less than a first width.

3. The method of claim 2, wherein the first width is about 90 nm.

4. The method of claim 1, further comprising:
coloring the via masks after the assigning is done.

5. The method of claim 1, wherein the via mask-split-rule violation marks are straight lines.

6. The method of claim 1, wherein the first weight is larger than the second weight.

7. The method of claim 1, further comprising:
assigning each of the underlying metal structures of the vias to one of two metal masks, and wherein the underlying metal structures are part of a metal layer to be patterned by double patterning technology.

8. The method of claim 7, further comprising:
aligning each of the metal masks with one of the via masks, respectively.

9. The method of claim 8, further comprising:
aligning the metal masks with each other.

10. The method of claim 9, further comprising:
limiting vias that land on the same underlying metal structure to have pitches equal to or greater than a distance specified by a via-mask-split rule, wherein adjacent vias with pitches less than the distance are assigned to different said via masks.

11. The method of claim 10, further comprising:
defining a via mask-split rule for space between vias that land on different underlying metal structures; and
defining a metal mask-split rule for space between said different underlying metal structures, wherein the via mask-split rule is the same as or less strict than the metal mask-split rule.

12. A computer-readable storage medium embodying instructions for causing, when executed by a processor, the processor to perform a method of via patterning mask assignment for a via layer using double patterning technology, wherein vias of the via layer land on respective underlying metal structures, said method comprising:
generating via mask-split-rule violation marks for vias of the via layer, wherein the via mask-split-rule violation marks connect vias that violate at least a via mask-split rule;
determining if a via touches one of the via mask-split-rule violation marks,
if the via does not touch one of the via mask-split-rule violation marks, assigning the via to one of two via masks which aligns with the underlying metal structure on which the via lands,
if the via touches one of the via mask-split-rule violation marks, proceeding to determine if the via is an end via,
if the via is an end via, assigning a first weight to the via,
if the via is not an end via, assigning a second weight to the via, and assigning each via that touches one of the via mask-split-rule violation marks to one of the two via masks such that vias with the first weight are given higher priority in being assigned to the via masks aligning with the underlying metal structures that the vias land on.

13. A computer system, comprising:
a processor configured to perform a method of via patterning mask assignment for a via layer using double patterning technology, said method comprising:
generating via mask-split-rule violation marks for the via layer, wherein the via mask-split-rule violation marks connect vias that violate at least a via mask-split rule;
if a via does not touch the via mask-split-rule violation marks, assigning the via to one of two via masks which is configured to align with the underlying metal structure on which the via lands; and
if the via touches one of the via mask-split-rule violation marks, resolving a mask-split-rule violation corresponding to the one of the via mask-split-rule violation marks by prioritizing assignment of the via to one of the two via masks which is configured to align with the underlying metal structure on which the via lands, wherein the via is given a higher priority if the via is an end via than that if the via is not an end via.

14. The computer system of claim 13, further comprising:
a memory subsystem, wherein the memory subsystem stores instructions for the method.

15. A method of preparing a first via mask and a second via mask for forming vias of a via layer in an integrated circuit based on double-patterning technology, the method comprising:
determining, by a processor, if a mask-split-rule violation exists for a via of the vias, the via landing on an underlying metal structure of an underlying meal layer in the integrated circuit;
after it is determined that the mask-split-rule violation does not exist, assigning the via to the first via mask, the first via mask being positioned over the underlying meal layer according to an alignment with the underlying metal structure; and
after it is determined that the mask-split-rule violation exists, assigning the via to one of the first via mask and the second via mask to resolve the mask-split-rule violation, the second via mask being positioned over the underlying meal layer according to an alignment with another underlying metal structure of the underlying meal layer.

16. The method of claim 15, wherein the determining if the mask-split-rule violation exists comprises:
generating a via mask-split-rule violation mark identifying at least two vias of the via layer that violate at least a via mask-split rule; and
determining if the via is identified in the via mask-split-rule violation mark.

17. The method of claim 16, wherein the via mask-split-rule violation mark comprises a straight line.

18. The method of claim 15, wherein the assigning the via after it is determined that the mask-split-rule violation exists comprises:
    assigning a weight to the via according to a size of the via;
    prioritizing all vias having the mask-split-rule violation according to corresponding weights thereof; and
    resolving the mask-split-rule violation by assigning the via preferably to the first via mask and alternatively to the second via mask according to the prioritization of all the vias having the mask-split-rule violation.

19. The method of claim 15, wherein the mask-split-rule violation comprises an arrangement that a distance between the via and another via of the via layer landing on the underlying metal structure is less than a predetermined distance.

20. The method of claim 15, wherein the mask-split-rule violation comprises violation of a via mask-split rule for space between vias that land on different underlying metal structures of the underlying meal layer.

* * * * *